United States Patent
Chung et al.

(10) Patent No.: US 7,262,069 B2
(45) Date of Patent: Aug. 28, 2007

(54) 3-D INDUCTOR AND TRANSFORMER DEVICES IN MRAM EMBEDDED INTEGRATED CIRCUITS

(75) Inventors: Young Sir Chung, Chandler, AZ (US); Robert W. Baird, Gilbert, AZ (US); Mark A. Durlam, Chandler, AZ (US); Bradley N. Engel, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 114 days.

(21) Appl. No.: 11/147,599

(22) Filed: Jun. 7, 2005

(65) Prior Publication Data

US 2006/0273418 A1    Dec. 7, 2006

(51) Int. Cl.
*H01L 21/00* (2006.01)

(52) U.S. Cl. .................. 438/48; 257/421; 257/295; 438/3; 438/239

(58) Field of Classification Search .............. 438/3, 438/E21.665, 128, 6, 48, 57, 73, 239; 365/97, 365/101, 99; 257/421, 295
See application file for complete search history.

(56) References Cited

U.S. PATENT DOCUMENTS

| | | | | |
|---|---|---|---|---|
| 5,446,311 | A * | 8/1995 | Ewen et al. | 257/531 |
| 5,884,990 | A * | 3/1999 | Burghartz et al. | 336/200 |
| 2003/0156449 | A1* | 8/2003 | Ooishi | 365/171 |
| 2004/0164839 | A1 | 8/2004 | Park et al. | |
| 2004/0222487 | A1 | 11/2004 | Tanabe | |

* cited by examiner

Primary Examiner—Theresa Doan
Assistant Examiner—Sarah K. Harding
(74) Attorney, Agent, or Firm—Ingrassia Fisher & Lorenz

(57) ABSTRACT

An integrated circuit device includes a magnetic random access memory ("MRAM") architecture and at least one inductance element formed on the same substrate using the same fabrication process technology. The inductance element, which may be an inductor or a transformer, is formed at the same metal layer (or layers) as the program lines of the MRAM architecture. Any available metal layer in addition to the program line layers can be added to the inductance element to enhance its efficiency. The concurrent fabrication of the MRAM architecture and the inductance element facilitates an efficient and cost effective use of the physical space available over active circuit blocks of the substrate, resulting in three-dimensional integration.

10 Claims, 4 Drawing Sheets

3-D INDUCTOR AND TRANSFORMER DEVICES IN MRAM EMBEDDED INTEGRATED CIRCUITS

TECHNICAL FIELD

The present invention relates generally to electronic devices. More particularly, the present invention relates to an integrated circuit device that includes magnetic random access memory ("MRAM") structures and inductor/transformer structures formed on a single substrate.

BACKGROUND

MRAM is a nonvolatile memory technology that uses magnetic polarization to store data, in contrast to older RAM technologies that use electronic charges to store data. One primary benefit of MRAM is that it retains the stored data in the absence of applied system power, thus, it is a nonvolatile memory. Generally, MRAM includes a large number of magnetic cells formed on a semiconductor substrate, where each cell represents one data bit. A bit is written to a cell by changing the magnetization direction of a magnetic element within the cell, and a bit is read by measuring the resistance of the cell (low resistance typically represents a "0" bit and high resistance typically represents a "1" bit).

An MRAM device generally includes an array of cells that are programmed using programming lines, conductive bit lines, and conductive digit lines. Practical MRAM devices are fabricated using known semiconductor process technologies. For example, the bit and digit lines are formed from different metal layers, which are separated by one or more insulating and/or additional metal layers. Conventional fabrication processes allow distinct MRAM devices to be easily fabricated on a devoted substrate.

The miniaturization of many modern applications make it desirable to shrink the physical size of electronic devices, integrate multiple components or devices into a single chip, and/or improve circuit layout efficiency. It is desirable to have a semiconductor-based device that includes an MRAM architecture integrated with an inductance element on a single substrate, where the MRAM architecture and the inductance element are fabricated using the same process technology. In addition, it is desirable to have a microfabricated inductance element, such as a transformer or an inductor, that utilizes magnetic cladding techniques for enhanced performance and efficiency. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

For the sake of brevity, conventional techniques and features related to MRAM design, MRAM operation, semiconductor device fabrication, and other aspects of the integrated circuit devices may not be described in detail herein. Furthermore, the circuit/component layouts and configurations shown in the various figures contained herein are intended to represent example embodiments of the invention. It should be noted that many alternative or additional circuit/component layouts may be present in a practical embodiment.

Figure 1:
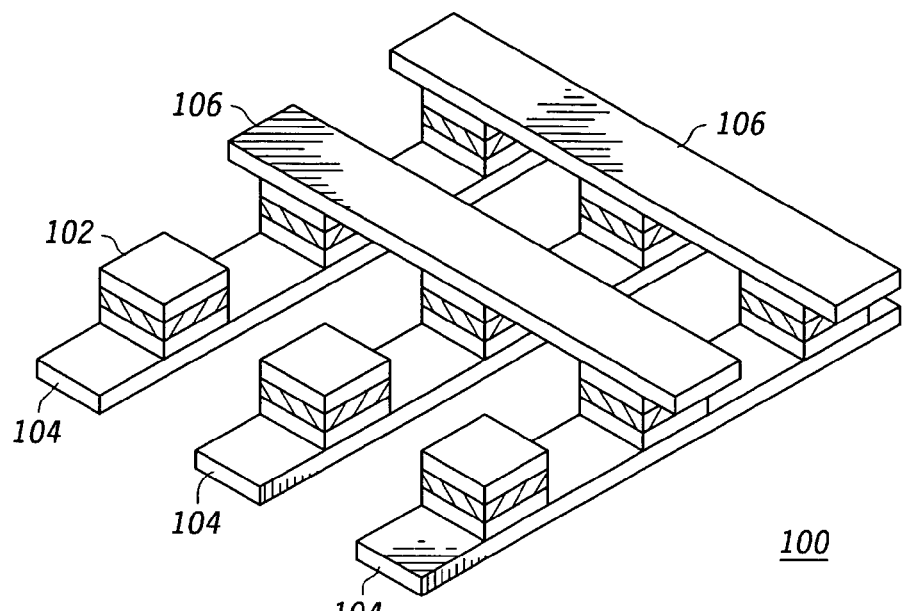
FIG. 1 is a schematic perspective view of a simplified MRAM architecture.

FIG. 1 is a schematic perspective view of a simplified MRAM architecture 100, which is formed on a substrate (not shown in FIG. 1) using a suitable semiconductor fabrication process. Although MRAM architecture 100 includes only nine cells, a practical MRAM device will typically include millions of cells. Generally, MRAM architecture 100 includes at least one digit line 104 formed from one metal layer, at least one bit line 106 formed from another metal layer, and a magnetic tunnel junction ("MTJ") core formed between the two metal layers. The MTJ core includes cells 102 that form an array of memory locations for MRAM architecture 100.

Figure 2:
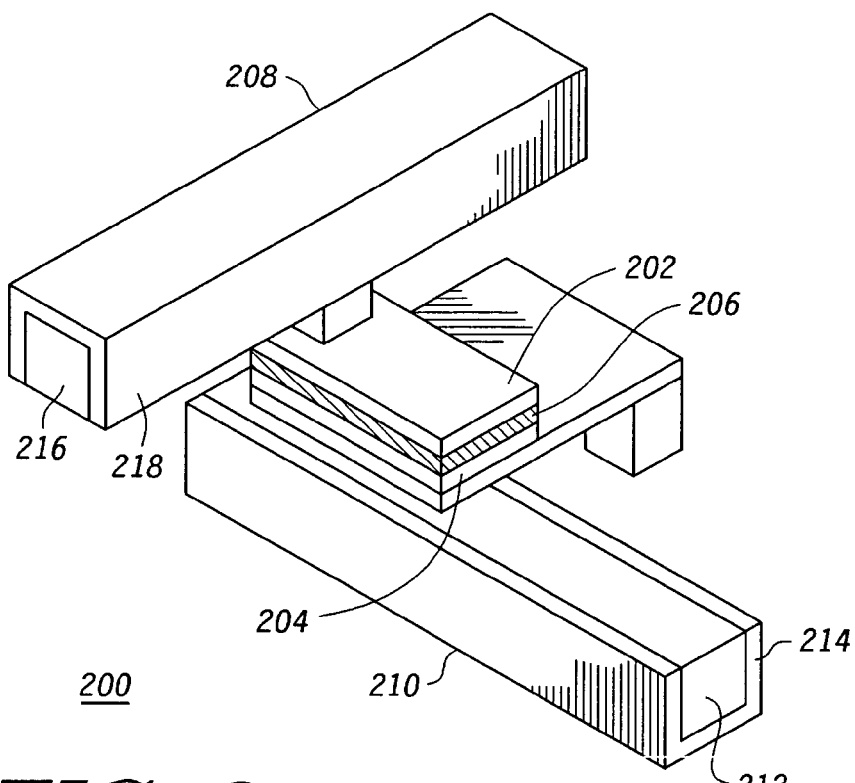
FIG. 2 is a schematic perspective view of an MRAM cell configured in accordance with an example embodiment of the invention.

FIG. 2 is a schematic perspective view of an MRAM cell 200 configured in accordance with an example embodiment of the invention. Each cell in MRAM architecture 100 may be configured as shown in FIG. 2. MRAM cell 200 generally includes an upper ferromagnetic layer 202, a lower ferromagnetic layer 204, and an insulating layer 206 between the two ferromagnetic layers. In this example, upper ferromagnetic layer 202 is the free magnetic layer because the direction of its magnetization can be switched to change the bit status of cell 200. Lower ferromagnetic layer 204, however, is the fixed magnetic layer because the direction of its magnetization does not change. When the magnetization in upper ferromagnetic layer 202 is parallel to the magnetization in lower ferromagnetic layer 204, the resistance across cell 200 is relatively low. When the magnetization in upper ferromagnetic layer 202 is anti-parallel to the magnetization in lower ferromagnetic layer 204, the resistance across cell 200 is relatively high. The data ("0" or "1") in a given cell 200 is read by measuring the resistance of the cell 200. The techniques utilized to read and write data to MRAM cell 200 are known to those skilled in the art and, therefore, will not be described in detail herein.

FIG. 2 also depicts a bit line 208 and a digit line 210 (individually and collectively referred to herein as "program lines") corresponding to cell 200. The orientation of the magnetization in free magnetic layer 202 rotates in response to current (and the direction of that current) flowing in digit line 210 and in response to current (and the direction of that current) flowing in bit line 208. In a typical MRAM, the orientation of the bit is switched by reversing the polarity of the current in bit line 208 while keeping a constant polarity of the current in digit line 210. In a practical deployment, bit line 208 may be connected to any number of similar MRAM cells (e.g., a column of cells) to provide a common write current to each of the connected cells. Similarly, digit line 210 may be associated with any number of similar MRAM cells (e.g., a row of cells) to provide a common digit current to each of the cells. This matrix configuration is schematically illustrated in FIG. 1.

In the preferred embodiment shown in FIG. 2, digit line 210 includes a conductive digit element 212 and a permeable cladding material 214 formed from a soft magnetic material. In this example, cladding 214 partially surrounds conductive digit element 212. In particular, cladding 214 is formed around three sides of conductive digit element 212 such that the inward facing surface of conductive digit element 212 remains uncladded. In the preferred embodiment shown in FIG. 2, bit line 208 includes a conductive bit element 216 and cladding 218 formed from a magnetic material. In this example, cladding 218 partially surrounds conductive bit element 216. In particular, cladding 218 is formed around three sides of conductive bit element 216 such that the inward facing surface of conductive bit element 216 remains uncladded. Cladding 214/218 may be utilized to focus the magnetic flux toward the magnetic tunnel junction ("MTJ") to improve the efficiency of programming. The cladding has an additional benefit of reducing the write disturbance to neighboring bits. In practical embodiments, the magnetic cladding is an integral part of the barrier layers used in the fabrication of copper program lines used in the MRAM process.

In practical embodiments, conductive digit element 212 and conductive bit element 216 are formed from an electrically conductive material such as copper, and cladding 214/218 is formed from a soft, permeable magnetic material such as NiFe, a nickel-iron-cobalt alloy, a cobalt-iron alloy, permalloy, or the like. In one example embodiment, cladding 214/218 is within the range of approximately 100 to 2000 Angstroms thick, and typically about 200 to 300 Angstroms thick (the sidewalls of cladding 214/218 may be slightly thinner). Although the conductive elements and the cladding are realized from different materials, conductive digit element 212 and cladding 214 are considered to be fabricated at one common metal layer (e.g., the metal four layer), and conductive bit element 216 and cladding 218 are considered to be fabricated at another common metal layer (e.g., the metal five layer).

Figure 3:
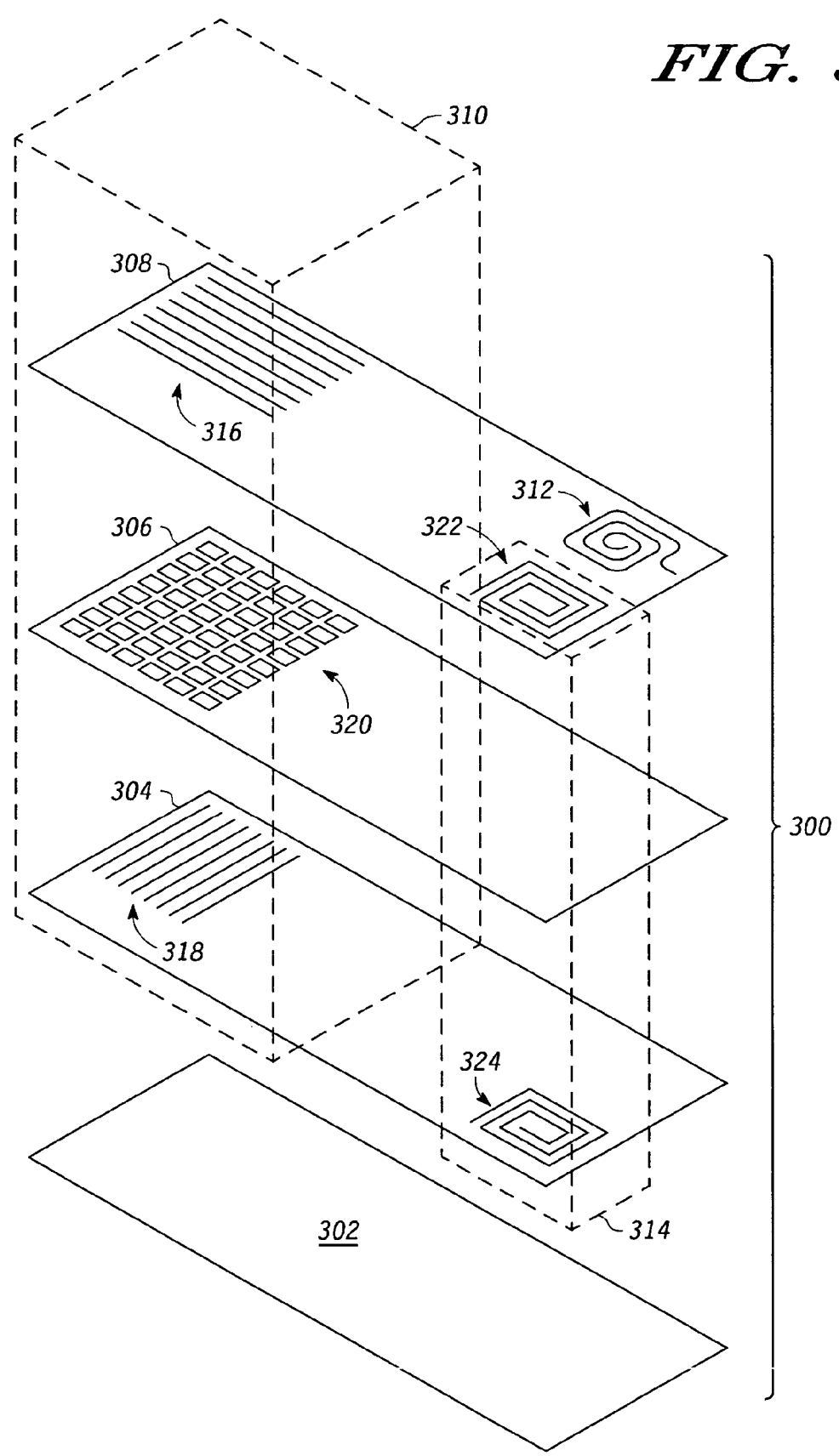
FIG. 3 is a simplified diagram of different layers and elements of an integrated circuit device configured in accordance with an example embodiment of the invention.

FIG. 3 is a simplified diagram of different layers and elements of an integrated circuit device 300 configured in accordance with an example embodiment of the invention. A practical embodiment of integrated circuit device 300 may include additional layers (e.g., metal layers, dielectric layers, and/or a ground plane) than that shown in FIG. 3. Furthermore, the circuit topology shown in FIG. 3 has been simplified to assist in the following description and the circuit topology need not represent a realistic operational embodiment.

Integrated circuit device 300 includes a substrate 302, which may be any suitable semiconductor material. Integrated circuit device 300 also includes at least a metal layer 304, an MTJ core "layer" 306, and another metal layer 308. In practice, metal layer 304 is a relatively low numbered metal layer and metal layer 308 is a relatively high numbered metal layer. For example, metal layer 304 may be the metal four layer, and metal layer 308 may be the metal five layer in integrated circuit device 300, where other metal layers are used for additional elements, features, or components not shown in FIG. 3. As described above in connection with FIG. 2, an MTJ core may be realized by more than one layer of material. For the sake of simplicity, however, FIG. 3 depicts the MTJ core as a single "layer" 306. The terms "first metal layer" and "second metal layer" may be used herein to differentiate between any two distinct metal layers, and "first metal layer" and "second metal layer" need not indicate the metal one and metal two layers, respectively. In other words, a "first metal layer" means any metal layer within integrated circuit device 300, regardless of any arbitrary layer numbering scheme, and a "second metal layer" means any other metal layer within integrated circuit device 300, regardless of any arbitrary layer numbering scheme.

In this example, the following components are formed on substrate 302 using suitable device fabrication processes: an MRAM architecture 310; a single layer inductor 312; and a dual layer transformer 314 (inductors, transformers, and transformer windings are all considered to be inductance elements for purposes of this description). MRAM architecture 310 includes a plurality of bit lines 316 formed on metal layer 308, a plurality of digit lines 318 formed on metal layer 304, and an array of MTJ cells 320 (the MTJ core layer 306 forms MTJ cells 320) formed between metal layer 304 and metal layer 308. In this example, inductor 312 is configured as a spiral inductor where the spiral element is formed on metal layer 308 concurrently with bit lines 316. In other words, the spiral element is created with the same device fabrication process used for the creation of MRAM architecture 310 (in some practical embodiments, the spiral element is formed from a copper conductive trace that is at least partially surrounded by a magnetic cladding). As described in more detail below, inductor 312 may have one or more additional features or elements formed on a layer (or layers) other than metal layer 308. Of course, a similar inductor can be formed on metal layer 304 concurrently with digit lines 318. As described in more detail below, a multiple layer inductor can also be formed from spiral elements on more than one metal layer.

In this example, transformer 314 includes a primary winding 322 formed from metal layer 308 and a secondary winding 324 formed from metal layer 304 (the "primary" and "secondary" designations can be reversed in an equivalent embodiment). As described in more detail below, primary winding 322 and secondary winding 324 may be configured to form two parallel coils when viewed from above or below; such an arrangement is desirable to facilitate good inductive coupling between primary winding 322 and secondary winding 324. In this example, primary winding 322 includes a spiral element formed on metal layer 308 concurrently with bit lines 316. Similarly, secondary winding 324 includes a spiral element formed on metal layer 304 concurrently with digit lines 318. In other words, transformer 314 is created with the same device fabrication process used for the creation of MRAM architecture 310 (in some practical embodiments, the windings are formed from copper conductive traces that are each at least partially surrounded by a respective magnetic cladding). As described in more detail below, transformer 314 may have one or more additional features or elements formed on a layer (or layers) other than metal layers 304/308.

Although not shown in FIG. 3, integrated circuit device 300 may include additional elements that are fabricated on one or more layers below inductor 312 and/or transformer 314. Such additional elements may be, without limitation, active circuits, analog components, CMOS-based digital logic elements, amplifiers, or the like. The integration of the inductance elements described herein with such additional circuitry allows a significant area saving as well as performance enhancement.

Figure 4:
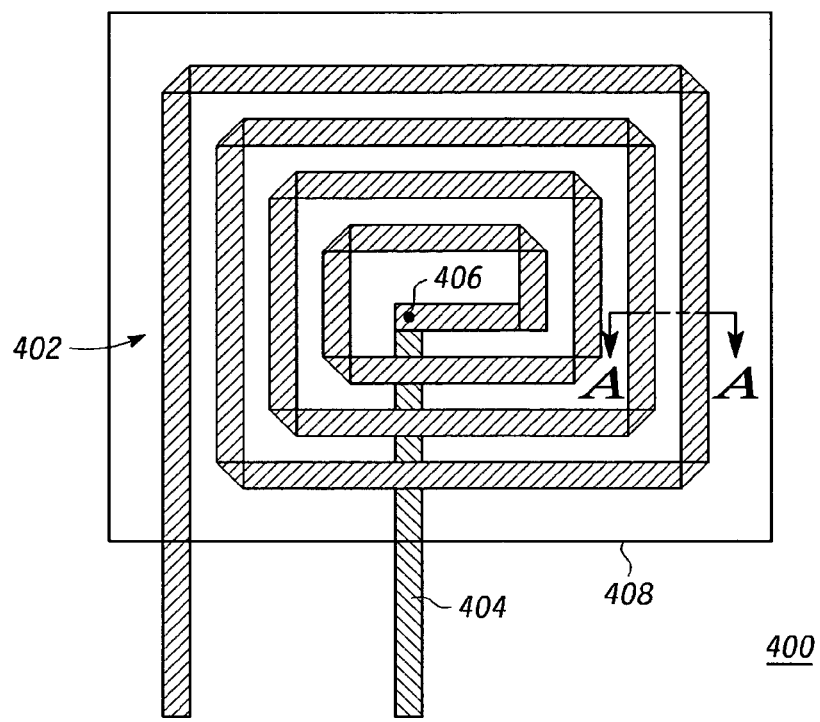
FIG. 4 is a top view of an inductor fabricated from a metal layer corresponding to MRAM program lines in accordance with an example embodiment of the invention.

In practice, an inductance element may include one or more features formed on substrate 302 from metal layer 304 alone, metal layer 308 alone, or both metal layers 304/308. The inductance element may include additional metal layers (assuming they are available) and/or conductive elements of MTJ core layer 306 to enhance the efficiency, primarily by reducing the line resistance of the inductance element. In addition, an integrated circuit device configured in accordance with the invention may employ inductors and/or transformers having configurations that vary from the simple topologies shown in FIG. 3. For example, FIG. 4 is a top view of an inductor 400 fabricated from a metal layer corresponding to MRAM program lines (either bit lines or digit lines) in accordance with an example embodiment of the invention. Inductor 400 generally includes a spiral or coil section 402, which is fabricated concurrently with the respective MRAM program lines on the same metal layer. Inductor 400 may be coupled to a conductive trace 404, which is preferably fabricated on a different metal layer than spiral section 402. Although conductive trace 404 can be formed on the other MRAM program line layer, in the preferred embodiment conductive trace 404 is formed on a metal layer that is relatively far removed from (e.g., well above or well below) the metal layer upon which spiral section 402 is formed. This is desirable to avoid counter emf induced in the conductor trace from interfering with the inductor mutual inductance. Conductive trace 404 may be coupled to spiral section 402 using a conductive via 406.

The device upon which inductor 400 resides may also include a magnetic shield layer 408 formed over inductor 400. Magnetic shield layer 408 is depicted as a phantom element in FIG. 4 for ease of illustration. Magnetic shield layer 408 may be formed from a suitable magnetic material such as, without limitation: NiFe, a nickel-iron-cobalt alloy, a cobalt-iron alloy, or permalloy. In practical embodiments, magnetic shield layer 408 is a relatively thick layer (approximately 20-40 microns thick), and the material used for magnetic shield layer 408 may also be used in connection with the MRAM architecture formed on the common substrate. Magnetic shield layer 408 functions to protect the MRAM architecture and inductor 400 from unwanted electromagnetic interference that might otherwise degrade performance. As described in more detail below, magnetic shield layer 408 may be suitably configured to also function as a heat sink element for inductor 400.

Figure 5:
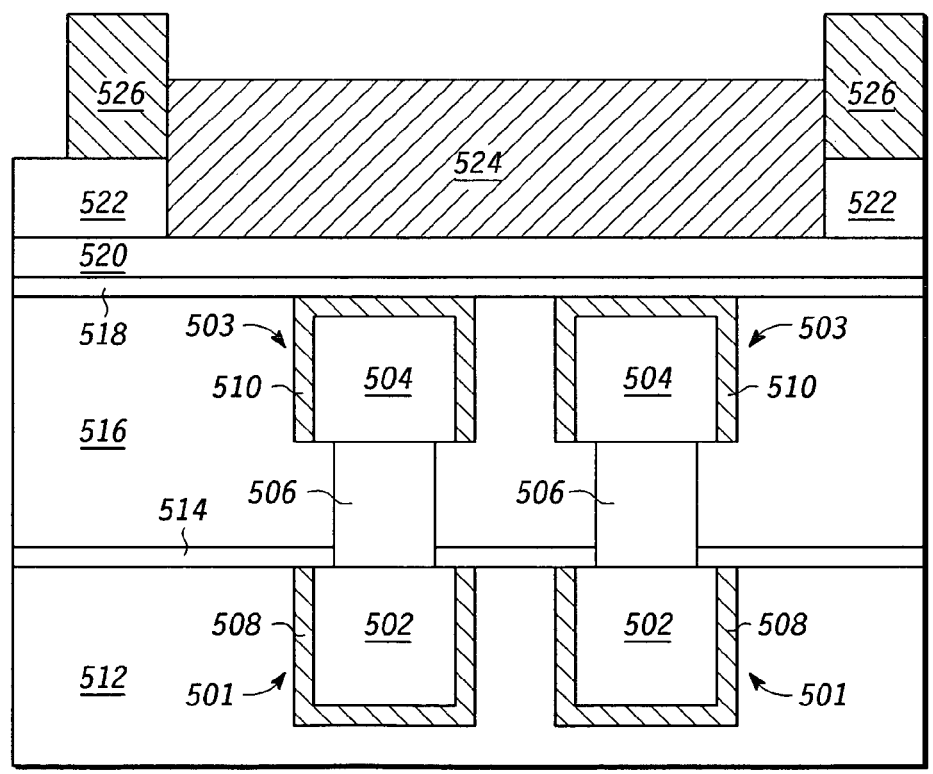
FIG. 5 is a cross sectional view of a dual layer inductor fabricated from metal layers corresponding to MRAM program lines in accordance with an example embodiment of the invention.

The layout of spiral section 402 can be duplicated on both metal layers (corresponding to the metal layers for the bit and digit lines) to create an overlapping topology having the same top view as inductor 400. In this regard, FIG. 5 is a cross sectional view of a dual layer inductor 500 fabricated from metal layers corresponding to MRAM program lines in accordance with an example embodiment of the invention. For reference purposes, FIG. 5 corresponds to a cross section viewed along line A-A in FIG. 4. In practice, MRAM is created using the final metal layers in a semiconductor fabrication process. Accordingly, for simplicity, FIG. 5 does not depict the substrate, lower metal layers, and lower dielectric layers that might otherwise be present in an actual device.

Briefly, inductor 500 includes one spiral element formed from one metal layer (e.g., the lower numbered metal layer corresponding to the digit lines of the MRAM architecture formed on the same substrate), another spiral element formed from another metal layer (e.g., the higher numbered metal layer corresponding to the bit lines of the MRAM architecture formed on the same substrate), and a number of conductive vias coupled between the two spiral elements. In FIG. 5, two segments of the spiral element formed on the lower metal layer are identified by reference number 501, two segments of the spiral element formed on the upper metal layer are identified by reference number 503, and two vias are identified by reference number 506. Vias 506, which can be created using suitable semiconductor device fabrication techniques, may be formed using any suitable conductive metal such as copper. In practice, vias 506 are positioned along the paths of the spiral elements to ensure that both spiral elements cooperate as a single inductance element.

Spiral element 501 may include a conductive inductor line 502 and cladding 508 that at least partially surrounds conductive inductor line 502. Similarly, spiral element 503 may include a conductive inductor line 504 and cladding 510 that at least partially surrounds conductive inductor line 504. Notably, conductive inductor line 502 can be formed concurrently with (and from the same material as) the conductive digit line elements of the MRAM architecture that shares the common substrate, and conductive inductor line 504 can be formed concurrently with (and from the same material as) the conductive bit line elements of the MRAM architecture. Likewise, cladding 508 can be formed concurrently with (and from the same material as) the cladding for the conductive digit line elements of the MRAM architecture, and cladding 510 can be formed concurrently with (and from the same material as) the cladding for the conductive bit line elements of the MRAM architecture. Such concurrent fabrication enables the integrated circuit device to leverage the process technology of the MRAM architecture to create inductive elements on chip space that might otherwise be wasted.

In a practical embodiment, the formation of inductor 500 may result in a first dielectric layer 512 (e.g., silicon oxide), a first plasma enhanced nitride layer 514 (which functions as an etch stop), a second dielectric layer 516 (e.g., silicon oxide), a second plasma enhanced nitride layer 518, and a passivation layer 520. As shown in FIG. 5, passivation layer 520 is formed over inductor 500. An alternate embodiment also utilizes a Metal Cap ("MCAP") layer, such as aluminum, formed between cladding 510 and second plasma enhanced nitride layer 518 (the MCAP layer is not shown in FIG. 5). The MCAP layer may be desirable to provide reduced inductor line resistance and promote mutual inductance of the inductor. The MCAP layer is normally used in a copper interconnect process to provide a platform for wire bonding to bond pads as pure copper bond pads present a significant manufacturing challenge for wire bonding. The MCAP layer is constructed from a thick aluminum to promote wire bonding and probing during the manufacturing process.

An MRAM architecture typically includes a polyimide (or a suitable equivalent material) layer that serves as a stress buffer. In practical embodiments, the polyimide layer is approximately five microns thick. The polyimide layer is formed on the passivation layer of the MRAM architecture. FIG. 5 shows sections of a polyimide layer 522 that can be formed concurrently with the polyimide layer of the MRAM architecture that shares the common substrate with inductor 500. FIG. 5 illustrates how a section of polyimide layer 522 above the spiral elements 501/503 can be removed to enable the formation of a magnetic shield layer 524 that contacts passivation layer 520. As mentioned previously, magnetic shield layer 524 is approximately 20-40 microns thick and it may be formed from a soft magnetic material such as, without limitation: NiFe, a nickel-iron-cobalt alloy, a cobalt-iron alloy, or permalloy. The material that forms magnetic shield layer 524 can also be deposited over the remaining sections of polyimide layer 522 to form a magnetic shield layer 526 for the MRAM architecture and/or other components or features of the integrated circuit device.

The removal of polyimide layer 522 above spiral elements 501/503 is desirable to allow magnetic shield layer 524 to also function as a heat sink for inductor 500, which can generate a significant amount of heat in a practical deployment. Thus, magnetic shield layer 524 can function as a more efficient heat transfer mechanism without an intervening polyimide layer 522. In addition, the removal of polyimide layer 522 above spiral elements 501/503 promotes mutual inductance, which is desirable in practical applications.

Figure 6:
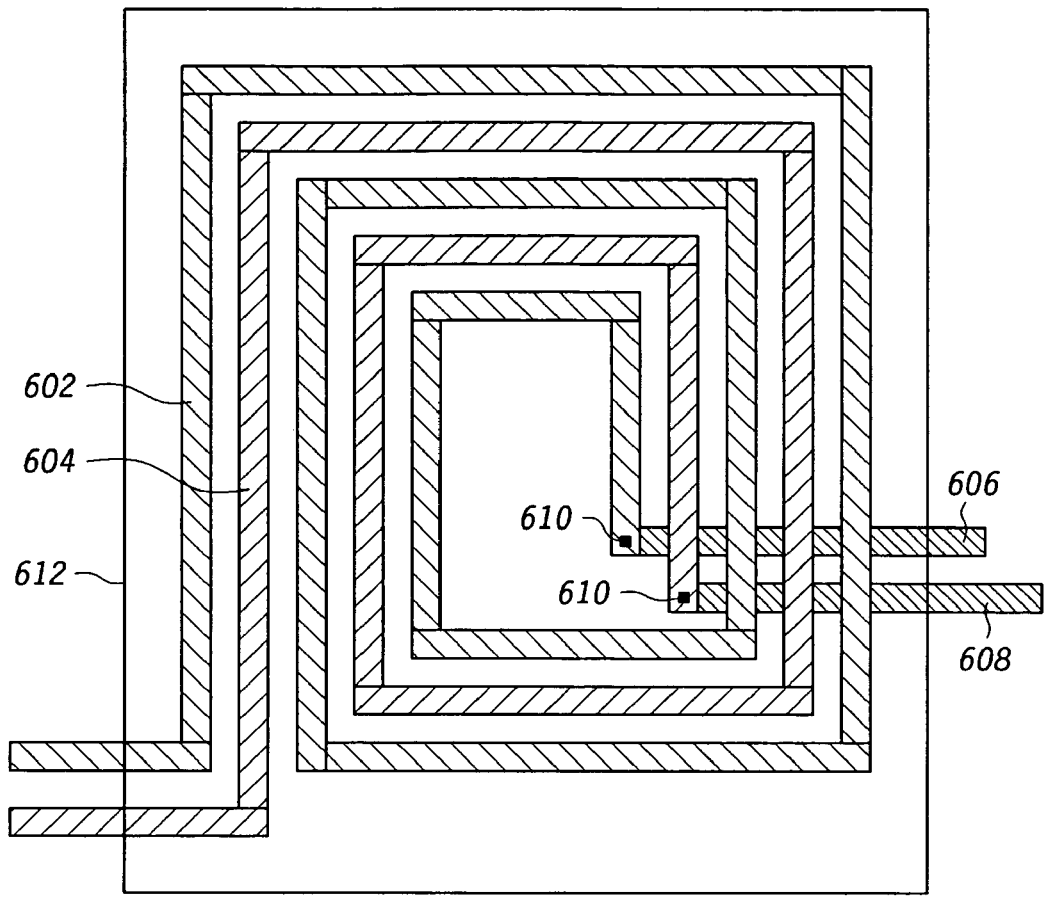
FIG. 6 is a top phantom view of a transformer fabricated from metal layers corresponding to MRAM program lines in accordance with an example embodiment of the invention.

FIG. 6 is a top view of a transformer 600 fabricated from metal layers corresponding to MRAM program lines in accordance with another example embodiment of the invention. FIG. 6 is a phantom view that shows the projection of elements found on multiple layers. Transformer 600 generally includes a primary winding 602 formed on one metal layer, and a secondary winding 604 formed on another metal layer. As described above, these metal layers correspond to the metal layers used to form the program lines (the bit and digit lines) for the MRAM architecture that shares a common substrate with transformer 600. Primary winding 602 and secondary winding 604 are fabricated concurrently with the respective MRAM program lines on the respective metal layer. Primary winding 602 may be coupled to a conductive trace 606, which is preferably fabricated on a metal layer not used by the MRAM architecture. Similarly, secondary winding 604 may be coupled to a conductive trace 608, which is preferably fabricated on a metal layer not used by the MRAM architecture. In preferred embodiments, conductive traces 606/608 are formed on a metal layer that is relatively far removed from (e.g., well above or well below) the metal layers upon which primary winding 602 and secondary winding 604 are formed. This is desirable to prevent counter emf induced in the traces from degrading transformer performance. Conductive traces 606/608 may be respectively coupled to primary and secondary windings 602/604 using conductive vias 610.

In the example embodiment, primary winding 602 and secondary winding 604 are arranged in a parallel relationship (from the perspective of FIG. 6). In an alternate embodiment, primary winding 602 and secondary winding 604 may partially or completely overlap each other. Of course, a practical implementation of transformer 600 can have any desired topology or layout depending upon the desired electromagnetic properties and characteristics.

The device upon which transformer 600 resides may also include a magnetic shield layer 612 formed over transformer 600. Magnetic shield layer 612 is depicted as a phantom element in FIG. 6 for ease of illustration. Magnetic shield layer 612 may have the same properties and characteristics as magnetic shield layer 408 described above. Magnetic shield layer 612 can function to protect the MRAM architecture and transformer 600 from unwanted electromagnetic interference that might otherwise degrade performance. In addition, magnetic shield layer 612 can function as a heat sink element for transformer 600. Furthermore, magnetic shield layer 612 can function as a magnetic transformer core layer for transformer 600, thus enhancing the coupling between primary winding 602 and secondary winding 604.

An alternate transformer configuration (not shown) can utilize the MTJ core "layer" of the MRAM architecture as a magnetic transformer core layer for one or more transformer windings having conductive segments on the MRAM program line metal layers. In this configuration, conductive vias are employed to couple the conductive segments on one of the metal layers to conductive segments on the other metal layer. The conductive segments are patterned such that the MTJ core is wrapped by the conductive segments and the vias.

An integrated circuit device as described herein can be fabricated using existing semiconductor fabrication processes and, in particular, using existing MRAM fabrication processes. As mentioned above, MRAM is typically fabricated using the final metal layers and, therefore, the formation and processing of underlying layers and components will not be described herein. The dual layer inductor 500 shown in FIG. 5 will be utilized for this example, assuming that the MRAM program lines are formed on the metal four and metal five layers.

At an appropriate point in the fabrication process, the digit lines of the MRAM architecture and spiral elements 501 are concurrently formed above the common substrate (at the metal four layer). In practice, the MRAM architecture should be physically separated from the inductance element(s) to reduce the likelihood of electromagnetic interference and undesired coupling. Accordingly, the pattern for the fourth metal layer (and the fifth metal layer described below) should reflect such a desired layout. The creation of the digit lines and spiral elements 501 may employ well known masking, reactive ion etching, physical sputtering, damascene patterning, physical vapor deposition, electroplating, chemical vapor, and plasma enhanced chemical vapor deposition techniques to form the conductive program line elements, the conductive inductor line elements, and the respective cladding. Eventually, spiral elements 501 reside within dielectric layer 512.

Thereafter, first plasma enhanced nitride layer 514 is deposited and etched and conductive vias 506 are formed. Next, the bit lines of the MRAM architecture and spiral elements 503 are concurrently formed at the metal five layer. The creation of the bit lines and spiral elements 503 may employ known masking, etching, damascene, deposition, and other techniques to form the conductive program line elements, the conductive inductor line elements, and the respective cladding. Eventually, spiral elements 503 reside within dielectric layer 516.

Thereafter, second plasma enhanced nitride layer 518 is deposited over spiral elements 503 and over the bit lines of the MRAM architecture, passivation layer 520 is deposited over second plasma enhanced nitride layer 518, and polyimide layer 522 is deposited over passivation layer 520. Assuming that the integrated circuit device will include magnetic shield layer 524 that also serves as a heat sink, then polyimide layer 522 will be suitably patterned and etched to expose passivation layer 520 at the desired locations. Once polyimide layer 522 is etched, a suitable magnetic material can be deposited to create magnetic shield layer 524 on passivation layer 520 and to create magnetic shield layer 526 on polyimide layer 522 (magnetic shield layer 526 is preferably deposited over the MRAM architecture).

Of course, an integrated circuit device as described herein can be fabricated using different process technologies that suit the needs of the particular device. Furthermore, the above process technology can be modified as needed to fabricate any of the inductor and transformer embodiments described herein.

In summary, circuits, devices, and methods configured in accordance with example embodiments of the invention relate to:

An integrated circuit device comprising a substrate; a magnetic random access memory ("MRAM") architecture formed on the substrate, the MRAM architecture comprising at least one digit line formed from a first metal layer, at least one bit line formed from a second metal layer, and a magnetic tunnel junction core formed between the first metal layer and the second metal layer; and an inductance element formed on the substrate from at least one of the first metal layer or the second metal layer. The inductance element may comprise a spiral inductor formed from the first metal layer. The inductance element may comprise a spiral inductor formed from the second metal layer. The inductance element may comprise a dual spiral inductor having a first spiral element formed from the first metal layer, a second spiral element formed from the second metal layer, and a number of conductive vias coupled between the first spiral element and the second spiral element. The integrated circuit may further comprise a magnetic shield layer formed over the inductance element. The magnetic shield layer may comprise a magnetic material. The integrated circuit may further comprise a passivation layer formed over the inductance element, the magnetic shield layer contacting the passivation layer for use as a heat sink. The inductance element may comprise a transformer. The transformer may comprise a primary winding formed from one of the first metal layer or the second metal layer, and a secondary winding formed from the other of the first metal layer or the second metal layer. The integrated circuit may further comprise a magnetic transformer core layer formed over the primary winding and over the secondary winding. The integrated circuit may further comprise a magnetic transformer core layer formed between the primary winding and the secondary winding. Each digit line may comprise a conductive digit element and first cladding formed from a magnetic material, the first cladding partially surrounding the conductive digit element, each bit line may comprise a conductive bit element and second cladding, formed from the magnetic material, the second cladding partially surrounding the conductive bit element, and the inductance element may comprise a conductive inductor line and third cladding, formed from the magnetic material, the third cladding partially surrounding the conductive inductor line.

A method of forming an integrated circuit device, the method comprising: forming, on a substrate, at least one digit line from a first metal layer; forming, on the substrate, at least one bit line from a second metal layer; forming, on the substrate and between the first metal layer and the second metal layer, a magnetic tunnel junction core, the at least one digit line, the at least one bit line, and the magnetic tunnel junction core comprising a magnetic random access memory ("MRAM") architecture; and forming, on the substrate, an inductance element from at least one of the first metal layer or the second metal layer. Forming the inductance element may comprise forming a spiral inductor from the first metal layer concurrently with the at least one digit line. Forming the inductance element may comprise forming a spiral inductor from the second metal layer concurrently with the at least one bit line. Forming the inductance element may comprise: forming a first spiral element from the first metal layer concurrently with the at least one digit line; forming a second spiral element from the second metal layer concurrently with the at least one bit line; and forming a number of conductive vias between the first spiral element and the second spiral element. The method may further comprise forming a magnetic shield layer over the inductance element. Forming the inductance element may comprise forming a transformer. Forming the transformer may comprise: forming a primary winding from the first metal layer concurrently with the at least one digit line; and forming a secondary winding from the second metal layer concurrently with the at least one bit line.

An integrated circuit device comprising: a substrate; a magnetic random access memory ("MRAM") array on the substrate, the MRAM array comprising program lines formed from a metal layer; and an inductance element on the substrate, the inductance element having a feature formed from the metal layer concurrently with the program lines. The inductance element may comprise a spiral inductor formed from the metal layer concurrently with the program lines. The inductance element may comprise a transformer having a winding formed from the metal layer concurrently with the program lines. Each of the program lines may comprise a conductive element and first magnetic cladding at least partially surrounding the conductive element, and the inductance element may comprise a conductive inductor line and second magnetic cladding at least partially surrounding the conductive inductor line, the conductive inductor line being formed concurrently with the conductive element and the second magnetic cladding being formed concurrently with the first magnetic cladding. The integrated circuit may further comprise at least one additional circuit component on the substrate, the at least one additional circuit component being formed below the inductance element.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A method of forming an integrated circuit device, said method comprising:

forming, on a substrate, at least one digit line from a first metal layer;

forming, on said substrate, at least one bit line from a second metal layer;

forming, on said substrate and between said first metal layer and said second metal layer, a magnetic tunnel junction core, said at least one digit line, said at least one bit line, and said magnetic tunnel junction core comprising a magnetic random access memory ("MRAM") architecture; and forming, on said substrate, an inductor from at least one of said first metal layer or said second metal layer, wherein the inductor is formed on a portion of said first metal layer that is physically separated from said at least one digit line or on a portion of said second metal layer that is physically separated from said at least one bit line.

2. A method according to claim 1, wherein forming said inductor comprises forming a spiral inductor from at least one of said first metal layer, concurrently with said at least one digit line, or said second metal layer, concurrently with said at least one bit line.

3. A method according to claim 1, further comprising forming a magnetic shield layer over said inductor.

4. A method according to claim 1, wherein forming said inductor comprises:
   forming the inductor as a coil section within an area of said first metal layer or said second metal layer that that does not intersect areas of said first metal layer or said second metal layer within which said at least one digit line or said at least one bit line are formed.

5. A method according to claim 1, wherein forming said inductor comprises:
   forming said inductor as a coil section having an area within which no other electrical components are located.

6. A method of forming an integrated circuit device, said method comprising:
   forming, on a substrate, at least one digit line from a first metal layer;
   forming, on said substrate, at least one bit line from a second metal layer;
   forming, on said substrate and between said first metal layer and said second metal layer, a magnetic tunnel junction core, said at least one digit line, said at least one bit line, and said magnetic tunnel junction core comprising a magnetic random access memory ("MRAM") architecture; and
   forming, on said substrate, a transformer from said first metal layer or said second metal layer by
      forming a first spiral element from said first metal layer concurrently with said at least one digit line,
      forming a second spiral element from said second metal layer concurrently with said at least one bit line, and
      forming a number of conductive vias between said first spiral element and said second spiral element, wherein the transformer is formed on portions of said first metal layer and portions of said second metal layer that are physically separated from said at least one digit line and from said at least one bit line.

7. A method according to claim 6, wherein forming said transformer comprises:
   forming a first spiral element from said first metal layer concurrently with said at least one digit line;
   forming a second spiral element from said second metal layer concurrently with said at least one bit line;
   forming at least one additional spiral element from at least one additional metal layer other than said first metal layer and said second metal layer; and
   forming a number of conductive vias between said first spiral element, said second spiral element, and said at least one additional spiral element.

8. A method according to claim 6, wherein forming said transformer comprises:
   forming a primary transformer winding from said first metal layer concurrently with said at least one digit line; and
   forming a secondary transformer winding from said second metal layer concurrently with said at least one bit line.

9. A method according to claim 6, wherein forming said transformer comprises:
   forming the transformer as a primary winding and a secondary winding within areas of said first metal layer and said second metal layer that do not intersect areas of said first metal layer and said second metal layer within which said at least one digit line and said at least one bit line are formed.

10. A method according to claim 6, wherein forming said transformer comprises:
    forming said transformer as a primary winding and a secondary winding having areas within which no other electrical components are located.

* * * * *